(12) United States Patent
Cho et al.

(10) Patent No.: US 6,887,788 B2
(45) Date of Patent: May 3, 2005

(54) METHOD OF MANUFACTURING SEMICONDUCTOR DEVICE

(75) Inventors: Jun Hee Cho, Kyoungki-do (KR); Il Wook Kim, Seoul (KR); Seok Kiu Lee, Kyoungki-do (KR); Tae Hang Ahn, Seoul (KR); Sung Eon Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/703,745

(22) Filed: Nov. 7, 2003

(65) Prior Publication Data
US 2004/0241982 A1 Dec. 2, 2004

(30) Foreign Application Priority Data
May 27, 2003 (KR) ................... 10-2003-0033772

(51) Int. Cl.[7] .......................................... H01L 21/4763
(52) U.S. Cl. ................. 438/672; 438/725; 438/710; 438/711; 438/906
(58) Field of Search ................ 438/587, 672, 438/725, 710, 711, 906, FOR 117, FOR 120, FOR 448

(56) References Cited

U.S. PATENT DOCUMENTS

| | | |
|---|---|---|
| 5,925,577 A | 7/1999 | Solis |
| 6,008,124 A | 12/1999 | Sekiguchi et al. |
| 6,693,040 B2 * | 2/2004 | Kim ............................. 438/700 |
| 6,713,234 B2 * | 3/2004 | Sandhu et al. ............... 430/313 |
| 6,740,585 B2 * | 5/2004 | Yoon et al. .................. 438/680 |
| 2002/0045355 A1 * | 4/2002 | Chong et al. ................ 438/721 |
| 2002/0064944 A1 * | 5/2002 | Chung et al. ............... 438/637 |
| 2003/0022513 A1 * | 1/2003 | Wu et al. .................... 438/710 |
| 2003/0068895 A1 * | 4/2003 | Kim ............................. 438/700 |
| 2003/0211685 A1 * | 11/2003 | Ohyagi ........................ 438/240 |

* cited by examiner

Primary Examiner—George Fourson
Assistant Examiner—Michelle Estrada
(74) Attorney, Agent, or Firm—Ladas & Parry LLP

(57) ABSTRACT

Disclosed is a method of manufacturing a semiconductor device. The method comprises the steps of: preparing a silicon substrate having a predetermined lower structure including a gate and a bonding area; forming an interlayer dielectric film on the top side of the substrate; forming a photosensitive film pattern, which exposes an area for providing contact, on the interlayer dielectric film; forming a contact hole exposing a bonding area of the substrate by etching the exposed part of the interlayer dielectric film; removing the photosensitive film pattern; performing a dry cleaning on the exposed bonding area of the substrate so that CF based polymer formed in the etching step is removed; and performing a nitrogen-hydrogen plasma processing on the surface of the exposed bonding area of the substrate so that oxygen polymer and remaining CF-based polymer are removed. Therefore, since hydrogen plasma processing is performed after contact etching, ohmic contact characteristics can be secured. In addition, since the hydrogen plasma processing is performed using a conventional photosensitive film strip apparatus, cost required to install and maintain an additional apparatus is not generated.

7 Claims, 5 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and more particularly to a method of manufacturing a semiconductor device, which has a clean contact interface.

2. Description of the Prior Art

According to the decrease of design rule of a semiconductor device, attentions are paid to several problems, including formation of a polymer during fine pattern etching, trouble in discharging the polymer to the atmosphere, increase of resistance due to limitation in the cleaning process, deterioration of reliability of the device due to the resistance increase, etc.

Particularly, a contact etching process for exposing a silicon substrate further requires ohmic characteristics according to high integration of a device. However, in fact, improvement in the integrated degree of a device makes it inevitable to apply a self-aligned contact (SAC) process, which is weak in a view of polymer generation. Further, it becomes more difficult to discharge polymer to the atmosphere according to decrease of contact open area and increase of contact depth. Moreover, formation of the polymer becomes more serious due to limitations of a wet cleaning process and so forth according to compactness of device patterns. As a result, securing ohmic characteristic during the contact etching process is very difficult.

Meanwhile, in an existing semiconductor manufacturing process, an appropriate dry cleaning process or a wet cleaning process is performed during at least a predetermined period of time after the contact etching, in order to maintain cleanness of a substrate in a contact process. This dry or wet cleaning eliminates etching residue and recovers damaged silicon grids.

However, such a dry or wet cleaning cannot provide perfect ohmic contact characteristics although it can maintain cleanness of a substrate in a certain degree.

Therefore, a technique in which a substrate is processed by hydrogen after contact etching has lately been proposed. In the case of post-processing the substrate by hydrogen, the cleaning effect of a contact interface is greatly improved, and thereby ohmic contact characteristics can be secured. Herein, an $H_2$ bake can be given as an example of post-processing by hydrogen.

A method using the $H_2$ bake is very useful from the viewpoint of enabling ohmic contact characteristics to be obtained, but it requires additional apparatuses for the $H_2$ bake, and thereby has a problem in that it is undesirable on the cost side, because additional cost for installation and maintenance of the apparatuses are required.

SUMMARY OF THE INVENTION

Accordingly, the present invention has been made to solve the above-mentioned problems occurring in the prior art, and an object of the present invention is to provide a method of manufacturing a semiconductor device capable of preventing cost increase due to apparatus installation cost and maintenance cost, while using a post-processing utilizing hydrogen so as to obtain ohmic contact characteristics.

In order to accomplish this object, there is provided a method of manufacturing a semiconductor device, the method comprising the steps of: preparing a silicon substrate having a predetermined lower structure including a gate and a bonding area; forming an interlayer dielectric film on the top side of the substrate; forming a photosensitive film pattern, which exposes an area for providing contact, on the interlayer dielectric film; forming a contact hole exposing a bonding area of the substrate by etching the exposed part of the interlayer dielectric film; removing the photosensitive film pattern; performing a dry cleaning on the exposed bonding area of the substrate so that CF based polymer formed in the etching step is removed; and performing a nitrogen-hydrogen plasma processing on the surface of the exposed bonding area of the substrate so that oxygen polymer and remaining CF-based polymer are removed.

Herein, the dry cleaning is performed using any one mixed gas from among a mixed gas of $O_2$ and $NF_3$ or a mixed gas Of $O_2$ and CxFy, and each flow of the $O_2$ gas, $NF_3$ gas, and CxFy gas consists of about 10~1000 sccm, 10~100 sccm, and 10~100 sccm, respectively.

The nitrogen-hydrogen plasma processing is performed using a strip apparatus used for removal of a photosensitive film pattern, using a mixed gas of $N_2$ and $H_2$ at a temperature range of room temperature ~900° C. in a pressure range of 2~1000 mTorr, and each flow of the $N_2$ gas and $H_2$ gas consists of about 1~10000 sccm and 10~800 sccm, respectively.

Also, in accordance with another aspect of the present invention, there is provided a method of manufacturing a semiconductor device, the method comprising the steps of: preparing a silicon substrate having a predetermined lower structure including a gate and a bonding area; forming an interlayer dielectric film on the top side of the substrate; forming a photosensitive film pattern, which exposes an area for providing contact, on the interlayer dielectric film; forming a contact hole exposing a bonding area of the substrate by etching the exposed part of the interlayer dielectric film; and performing a hydrogen-oxygen-nitrogen plasma processing on the resultant substrate in a photosensitive film strip apparatus so that the photosensitive film pattern is removed and also CF based polymer is removed, the CF based polymer being formed on the surface of the exposed bonding area of the substrate during the etching step.

Herein, the hydrogen-oxygen-nitrogen plasma processing is performed using any one mixed gas from among a mixed gas of $H_2+O_2+N_2$ or a mixed gas of $H_2+O_2+NF_3$ at a temperature range of room temperature ~900° C. in a pressure range of 2~1000 mTorr, and each flow of the $H_2$ gas, $O_2$ gas, $N_2$ gas, and $NF_3$ gas consists of 10~200 sccm, 10~1000 sccm, 10~100 sccm, and 10~100 sccm, respectively.

According to the present invention, since hydrogen plasma processing is performed after contact etching, ohmic contact characteristics can be secured. In addition, since the hydrogen plasma processing is performed using a conventional photosensitive film strip apparatus, cost required to install and maintain an additional apparatus is not generated.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
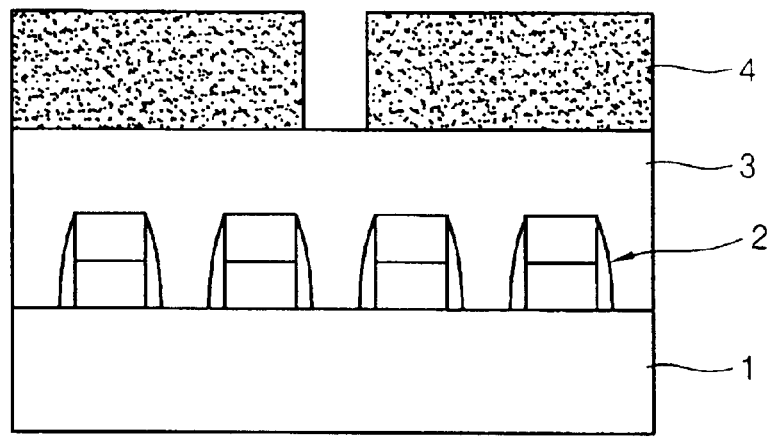
FIGS. 1a to 1d are cross-sectional views according to processes for explaining a method of manufacturing a semiconductor device according to an embodiment of the present invention.

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 1a to 1d are cross-sectional views according to processes for explaining a method of manufacturing a semiconductor device according to an embodiment of the present invention.

Referring to FIG. 1a, after a silicon substrate 1 forming predetermined lower structures including a few gates 2 and bonding area (not shown) is prepared, an interlayer dielectric film 3 is deposited on the entire top side of the substrate 1 so as to cover the gates 2. Next, a photosensitive film pattern 4 exposing contact formation area is formed on the interlayer dielectric film 3. Herein, it is preferred that the photosensitive film pattern 4 is realized by cycloolefin-maleic anhydride (COMA) or acrylate based polymer.

Figure 1B:
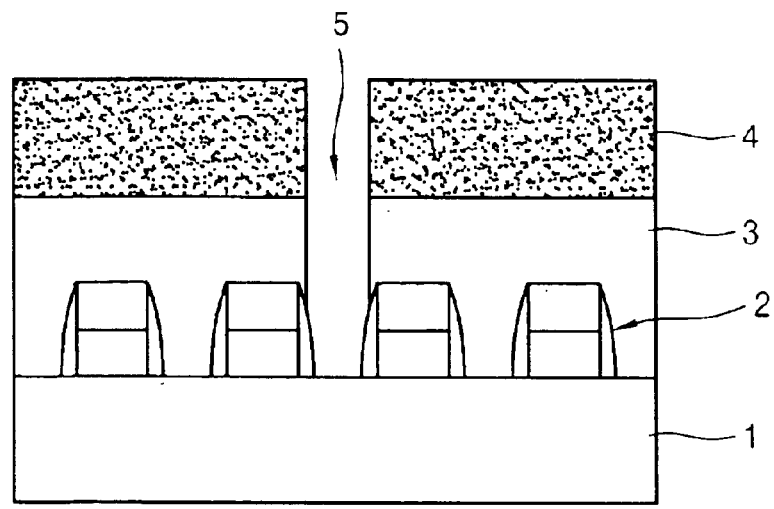

Referring to FIG. 1b, an exposed part of the interlayer dielectric film is etched by $CxFy+O_2$ gas using the photosensitive film pattern 4 as an etching barrier. Therefore, a contact hole 5 exposing a bonding area of the substrate between the gates 2 is formed. When the etching is performed, electrodes are maintained at a low temperature of −10 to −15° C.

Figure 1C:
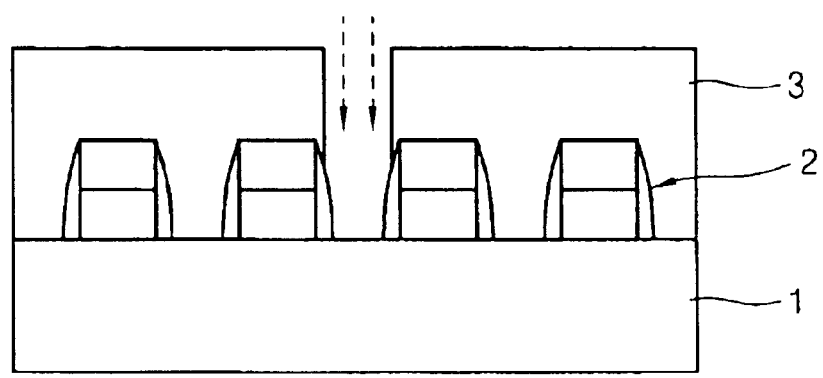

Referring to FIG. 1c, the photosensitive film pattern 4 having been used as an etching barrier is removed by a strip process known in the prior art. Subsequently, a dry cleaning is performed on the resultant substrate, thereby removing remaining CF-based polymer generated on the surface of the bonding area of the substrate exposed by the contact etching.

Herein, the dry cleaning is performed using a mixed gas Of $O_2$ and $NF_3$ or a mixed gas of $O_2$ and CxFy. At this time, each flow of the $O_2$ gas, $NF_3$ gas, and CxFy gas consists of 10~1000 sccm, 10~100 sccm, and 10~100 sccm respectively.

Figure 1D:
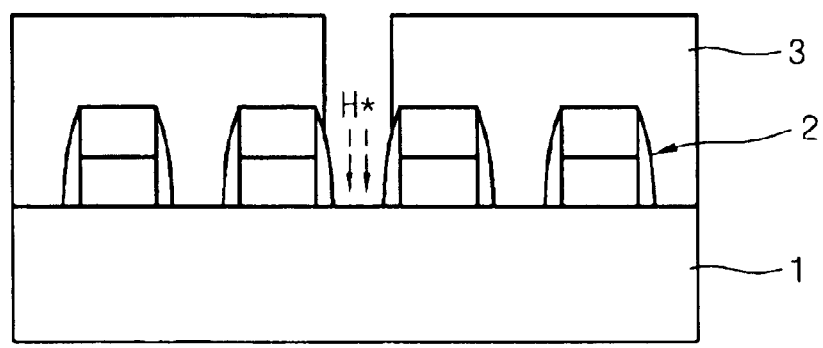

Referring to FIG. 1d, a plasma processing using hydrogen based gas, for example, a nitrogen-hydrogen plasma processing, is performed on the resultant substrate, thereby removing oxygen polymer and remaining CF-based polymer on the surface of the bonding area of the substrate exposed by the contact hole 5.

Herein, the nitrogen-hydrogen plasma processing is performed by a mixed gas of $N_2$ and $H_2$ using a strip apparatus used for removal of a photosensitive film pattern. At this time, each flow of the $N_2$ gas and $H_2$ gas consists of about 1~10000 sccm and 10~800 sccm respectively.

Also, in order to maximize the efficiency of polymer removal, temperature of the substrate is increased from room temperature up to 900° C., and a pressure of 2~1000 mTorr is applied. A remote plasma using microwaves is used as a plasma generation apparatus.

As a result of the nitrogen-hydrogen plasma processing, the surface of the exposed bonding area of the substrate has a significant cleaning effect, so that a clear surface, that is, a surface having ohmic characteristics, is obtained.

Figure 2:
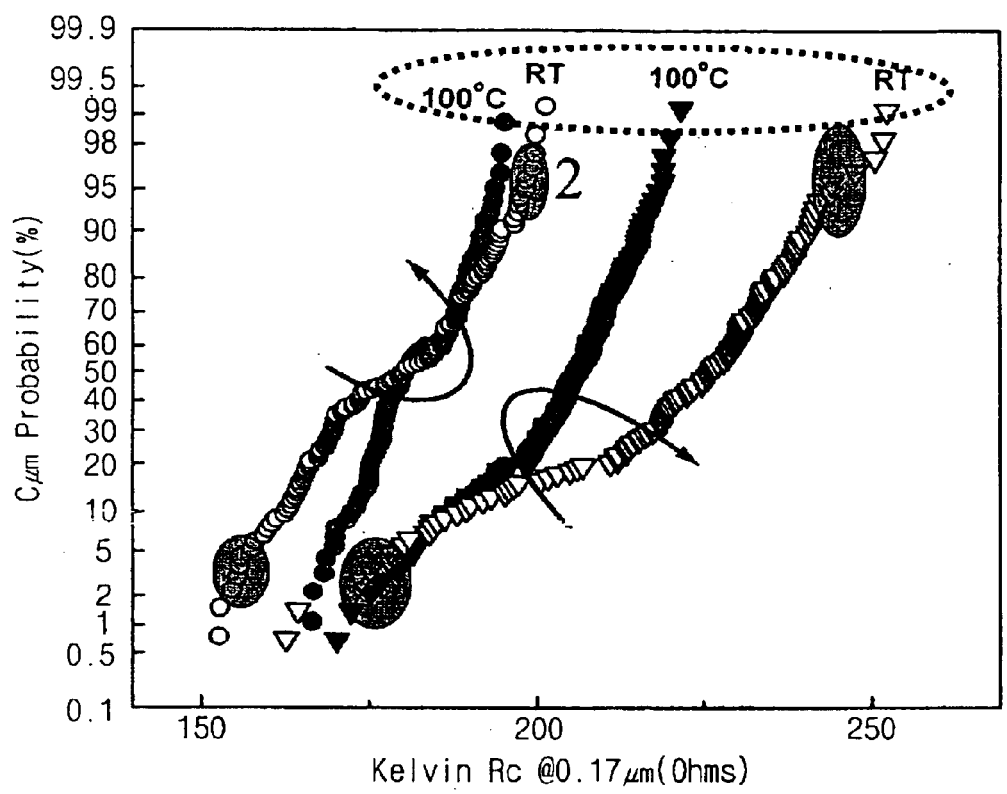
FIGS. 2 to 6 are graphs for explaining contact resistances in cases in which hydrogen plasma processing is applied and is not applied after contact etching.
Figure 3:
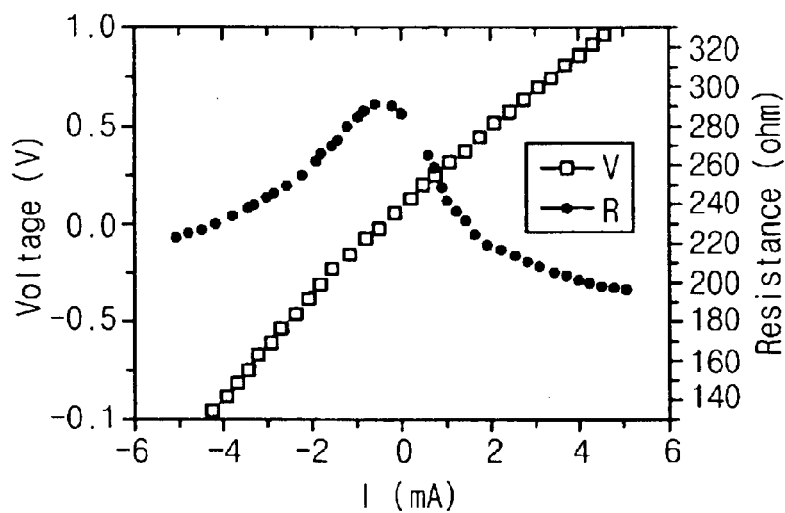
Figure 4:
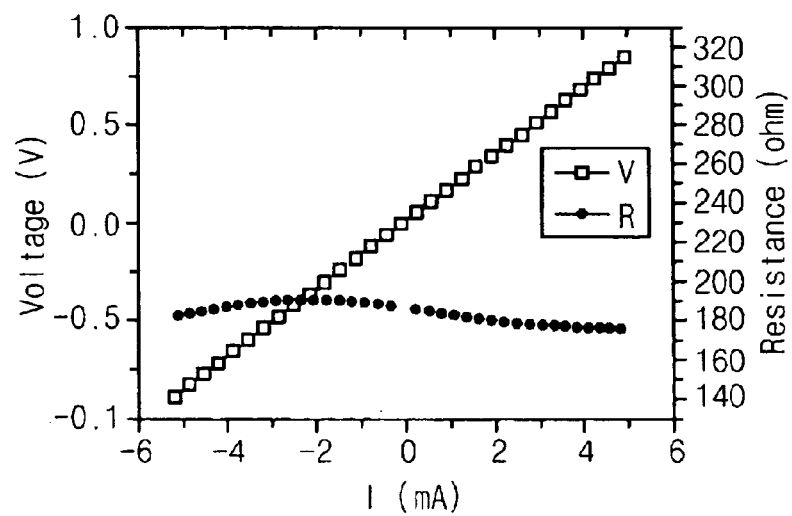
Figure 5:
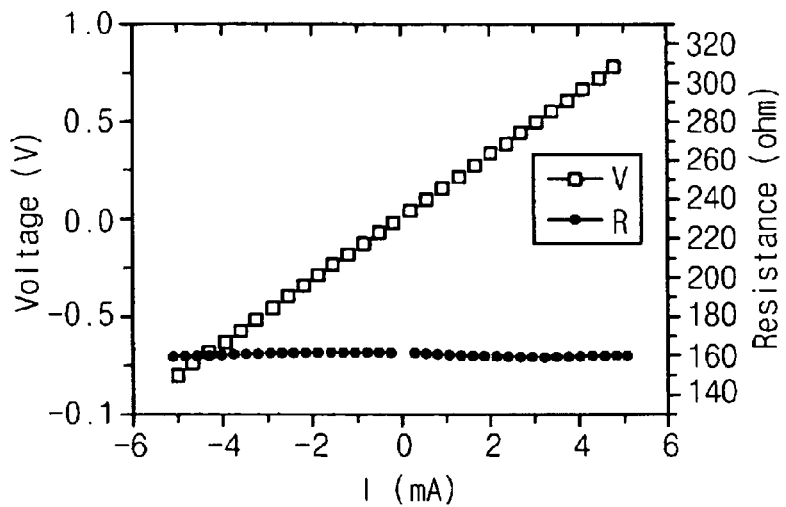
Figure 6:
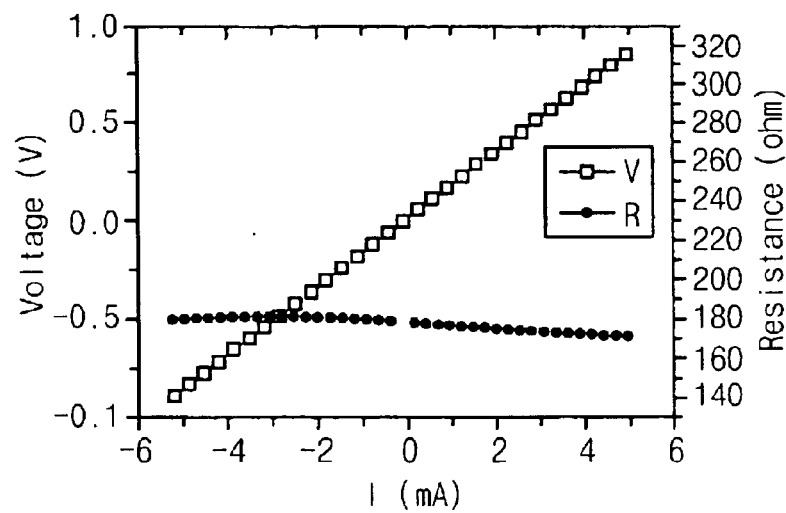

Meanwhile, FIGS. 2 to 6 are graphs for explaining contact resistances in cases in which hydrogen plasma processing is applied and is not applied after contact etching. That is, FIG. 2 is a graph illustrating contact resistance characteristics according to whether or not hydrogen plasma is applied after contact etching. FIGS. 3 and 4 are graphs illustrating resistance variation according to variation of current and voltage on a bottom and a top part in a case in which only contact etching is performed. Also, FIGS. 5 and 6 are graphs illustrating resistance variation according to variation of current and voltage on a bottom and a top part in a case in which hydrogen plasma processing is performed after contact etching.

Referring to FIG. 2, it can be seen that a case A in which hydrogen plasma is applied after contact etching has superior contact resistance to a case B in which only contact etching is performed.

Next, comparison between FIGS. 3 and 4 and FIGS. 5 and 6 shows that the case of FIGS. 5 and 6 in which hydrogen plasma processing is performed after contact etching has a more stable resistance, that is, has an improved resistance distribution, than the case of FIGS. 3 and 4 in which only the contact etching is performed without hydrogen plasma processing.

In the present invention, since the above-mentioned hydrogen plasma processing is performed using a conventional photosensitive film strip apparatus, installation costs and maintenance costs for a separate apparatus for hydrogen plasma processing are not required, and thereby additional cost is not incurred.

Thereafter, a semiconductor device according to the present invention is completed by performing the following processes known in the prior art in sequence.

Meanwhile, while the hydrogen plasma processing is performed after a dry cleaning in the method described above, the present invention may employ a method in which the hydrogen plasma processing is performed simultaneously when photosensitive film pattern is removed, so as to simplify the process.

That is, in the above-mentioned embodiment, photosensitive film pattern is removed after contact etching, a dry cleaning is performed, and then hydrogen plasma processing is performed. However, according to another embodiment of the present invention, after contact etching is performed, photosensitive film pattern is removed, and hydrogen plasma processing is simultaneously performed.

In this case, since the hydrogen plasma processing is performed simultaneously when photosensitive film pattern is removed, process stages can be reduced. In addition, the process can be simplified by omitting the dry cleaning.

Herein, in order to perform hydrogen plasma processing simultaneously when photosensitive film pattern is removed, in the present invention, the removal of the photosensitive film pattern is performed by hydrogen-oxygen-nitrogen plasma processing. In this case, a mixed gas of $H_2$, $O_2$, and $N_2$ and a mixed gas of $H_2$, $O_2$, and $NF_3$ are used. At this time, each flow of the $H_2$ gas, $O_2$ gas, $N_2$ gas, and $NF_3$ gas consists of about 10~200 sccm, 10~1000 sccm, 10~100 sccm, and 10~100 sccm, respectively. In addition, in order to maximize polymer removal, the plasma processing is performed at a temperature range of room temperature ~900° C. in a pressure range of 2~1000 mTorr.

As described above, according to the present invention, since hydrogen plasma processing is performed after contact etching, ohmic contact characteristics can be secured. Particularly, the hydrogen plasma processing is performed using a conventional photosensitive film strip apparatus, so that cost required to install and maintain an additional apparatus is not generated, and also process reliability can be improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor device, the method comprising the steps of:
    preparing a silicon substrate having a predetermined lower structure including a gate and a bonding area;
    forming an interlayer dielectric film on the top side of the substrate;
    forming a photosensitive film pattern, which exposes an area for providing contact, on the interlayer dielectric film;
    forming a contact hole exposing a bonding area of the substrate by etching the exposed part of the interlayer dielectric film;
    removing the photosensitive film pattern;
    performing a dry cleaning on the exposed bonding area of the substrate so that CF based polymer formed in the etching step is removed; and
    performing a nitrogen-hydrogen plasma processing on the surface of the exposed bonding area of the substrate so that oxygen polymer and remaining CF-based polymer are removed.

2. A method of manufacturing a semiconductor device as claimed in claim 1, wherein the dry cleaning is performed using any one mixed gas from among a mixed gas of $O_2$ and $NF_3$ or a mixed gas of $O_2$ and CxFy.

3. A method of manufacturing a semiconductor device as claimed in claim 2, wherein each flow of the $O_2$ gas, $NF_3$ gas, and CxFy gas consists of 10~1000 sccm, 10~100 sccm, and 10~100 sccm, respectively.

4. A method of manufacturing a semiconductor device as claimed in claim 1, wherein the nitrogen-hydrogen plasma processing is performed using a strip apparatus used for removal of a photosensitive film pattern.

5. A method of manufacturing a semiconductor device as claimed in claim 4, wherein the nitrogen-hydrogen plasma processing is performed using a mixed gas of $N_2$ and $H_2$.

6. A method of manufacturing a semiconductor device as claimed in claim 5, wherein each flow of the $N_2$ gas and $H_2$ gas consists of 1~10000 sccm and 10~800 sccm, respectively.

7. A method of manufacturing a semiconductor device as claimed in claim 5, wherein the nitrogen-hydrogen plasma processing is performed at a temperature range of room temperature ~900° C. in a pressure range of 2~1000 mTorr.

* * * * *